United States Patent [19]

Tannhaeuser et al.

[11] Patent Number: 4,692,920
[45] Date of Patent: Sep. 8, 1987

[54] APPARATUS FOR GENERATING PATTERNS OF TEST SIGNALS

[75] Inventors: Rolf Tannhaeuser, Krailling; Franz Herrmann, Schemmerhofen, both of Fed. Rep. of Germany

[73] Assignee: Siemens Aktiengesellschaft, Berlin and Munich, Fed. Rep. of Germany

[21] Appl. No.: 859,847

[22] Filed: Apr. 30, 1986

Related U.S. Application Data

[63] Continuation of Ser. No. 528,646, Sep. 1, 1983, abandoned.

[30] Foreign Application Priority Data

Oct. 8, 1982 [DE] Fed. Rep. of Germany ....... 3237365

[51] Int. Cl.[4] .......................................... G01R 31/28
[52] U.S. Cl. ...................................... 371/27; 371/25; 371/21; 324/73 R
[58] Field of Search ...................... 371/16, 27, 18, 20, 371/21, 25; 324/73 R, 73 AT

[56] References Cited

U.S. PATENT DOCUMENTS

| T930,005 | 1/1975 | Chia et al. | 371/27 |
|---|---|---|---|
| T932,005 | 3/1975 | Kruskal | 371/27 |
| 3,471,779 | 10/1969 | Ley | 371/27 |
| 3,924,181 | 12/1975 | Alderson | 371/27 |
| 4,204,633 | 5/1980 | Goel | 371/27 |
| 4,293,950 | 10/1981 | Shimizu et al. | 371/27 |
| 4,365,334 | 12/1982 | Smith et al. | 371/27 |
| 4,402,081 | 8/1983 | Ichimiya | 371/27 |
| 4,414,665 | 11/1983 | Kimura | 371/21 |
| 4,429,389 | 1/1984 | Catiller | 371/21 |
| 4,442,519 | 4/1984 | Jones et al. | 371/27 |
| 4,450,560 | 5/1984 | Conner | 371/25 |
| 4,451,918 | 5/1984 | Gillette | 371/27 |
| 4,453,227 | 6/1984 | Amann et al. | 364/900 |
| 4,493,079 | 1/1985 | Hughes | 371/27 |

Primary Examiner—Michael R. Fleming
Attorney, Agent, or Firm—Hill, Van Santen, Steadman & Simpson

[57] ABSTRACT

A tester generates test signals for tested units at high speed. At its connecting elements to which the unit under test is connected, the tester emits patterns of test signals, or receives output signals from the unit under test, and compares the same to the test signals. For the purpose of generating the test signals, a respective test generator is assigned to each connecting element, the test signals assigned to the connecting element being stored in coded form in the test signal generators. The coded test signals are addressed by an address control, the test signals to be emitted in the coded form over the connecting element or to be compared to output signals emitted by the unit under test. The test signal generator comprises a memory in which the coded test signals are stored and a decoder which assigns the test signal stored in the memory to the connecting element either in decoded form or unaltered.

9 Claims, 5 Drawing Figures

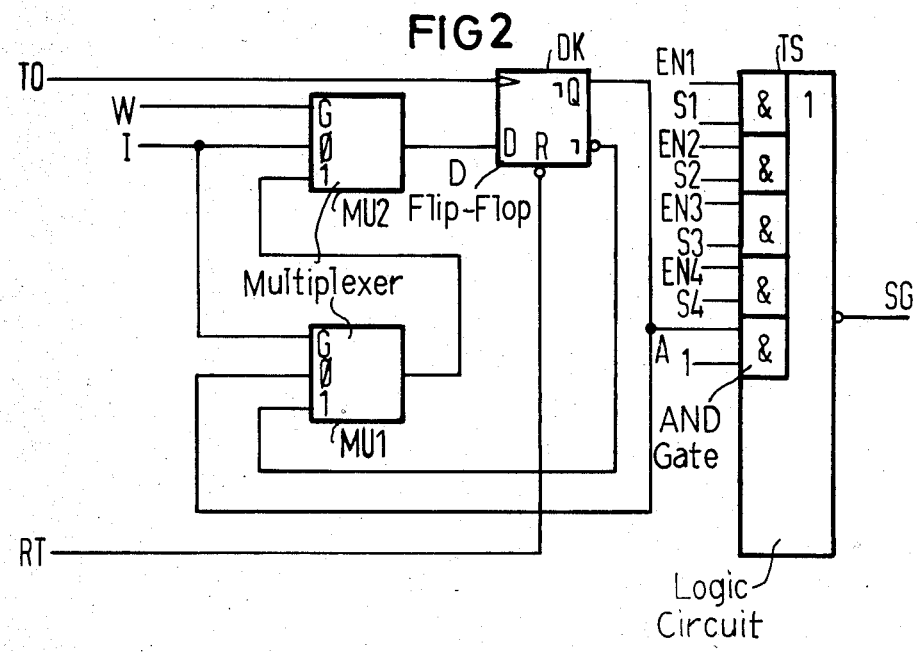
FIG 2
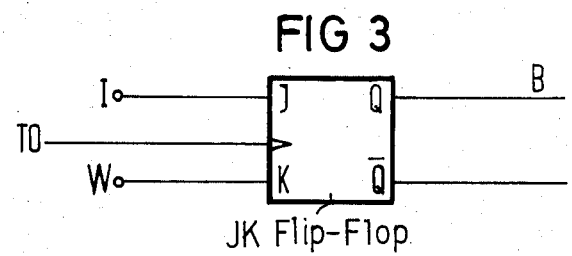
FIG 3
JK Flip-Flop
FIG 4
| W | I | Qn(A) | Qn(B) |
|---|---|-------|-------|
| 0 | 0 | 0 | $Q_{n-1}$ |
| 0 | 1 | 1 | 0 |
| 1 | 0 | $Q_{n-1}$ | 1 |
| 1 | 1 | $\overline{Q_{n-1}}$ | $\overline{Q_{n-1}}$ |

FIG 5

| P1 | P2 | P3 |     | W1 I1 | W2 I2 | W3 I3 |
|----|----|----|-----|-------|-------|-------|
| 0  | 0  | 0  | AD0 | 00    | 00    | 00    |
| 0  | 0  | 1  | AD1 | 10    | 10    | 11    |
| 0  | 1  | 0  | AD2 | 10    | 11    | 11    |
| 0  | 1  | 1  | AD1 | 10    | 10    | 11    |
| 1  | 0  | 0  | AD3 | 11    | 11    | 11    |
| 1  | 0  | 1  | AD1 | 10    | 10    | 11    |
| 1  | 1  | 0  | AD2 | 10    | 11    | 11    |
| 1  | 1  | 1  | AD1 | 10    | 10    | 11    |

APPARATUS FOR GENERATING PATTERNS OF TEST SIGNALS

This is a continuation of application Ser. No. 528,646, filed Sept. 1, 1983, now abandoned.

BACKGROUND OF THE INVENTION

1. Field of the Invention

The present invention relates to apparatus for generating patterns of test signals at a tester which are fed to the unit under test by way of connection elements, or which are compared to output signals emitted by the unit under test and transmitted over the connection elements.

2. Description of the Prior Art

Units undergoing test having a multitude of electronic components, for example, card modules, must be tested for freedom from error before being built into, for example, a data processing system. To this end, the modules are tested with the assistance of a tester which generates test signals necessary for testing the unit and which checks the output signals emitted by the unit. Since, for example, large scale integrated (LSI) assemblies must also be tested with such testers, require, with such assemblies working with high speeds, that the test signals must also be generated at high speed in the tester. The test signals are either transmitted to the unit under test over connection elements, for example, terminal pins, or are compared to output signals transmitted from the unit under test to the tester over the connecting elements.

SUMMARY OF THE INVENTION

The object of the present invention, therefore, is to provide apparatus for generating patterns of test signals by way of which test signals can be generated at a high speed and which nonetheless requires a low expense.

Given an arrangement of the type generally set forth above, the above object is achieved, according to the present invention, in that a respective test signal generator is assigned to each connector element, the test signals assigned to the connector element being stored in coded form in the test signal generator; and in that an address control is provided which addresses the coded test signals assigned to the connector element and stored in the test signal generator in their proper sequence.

The expense is particularly low when a central address control is provided for all test signal generators.

The test signal generator can comprise a memory in which the coded test signals assigned to the connector element are stored and which is connected to the address control and can comprise a decoder which is connected to the memory and which converts the coded test signals into uncoded test signals.

The memory can be kept small when the test signals in the memory are coded by way of two bits such that the one bit declares whether the logic level of the test signal changes relative to the preceding level and the second bit declares whether the decoder is to execute this change at the output. Identically coded signals need only be stored once in the memory in this case and the succession of the test signals can occur by way of the addresses stored in the address control.

The expense for the memory can be further reduced when the second bit is not stored in the memory of the test signal generators but, rather, is centrally stored in a memory of the address control.

It is advantageous when the decoder is constructed such that it can decode coded test signals and also transmit stored test signals uninfluenced.

The address control advantageously comprises a sequencer and a microprogram memory driven by the sequencer and in which the addresses of the memory are stored such that the memory emits the test signals in the desired sequence. The sequence of the addresses in the microprogram memory can be changed at any time.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 2 is a logic diagram of a first embodiment of a decoder for use in practicing the present invention;

FIG. 3 is a logic diagram of a second embodiment of a decoder for practicing the invention;

FIG. 4 is a truth table from which the operation of the decoders derives; and

FIG. 5 is a tabular presentation of an example of the sequence of coded test signals.

DESCRIPTION OF THE PREFERRED EMBODIMENTS

Figure 1:
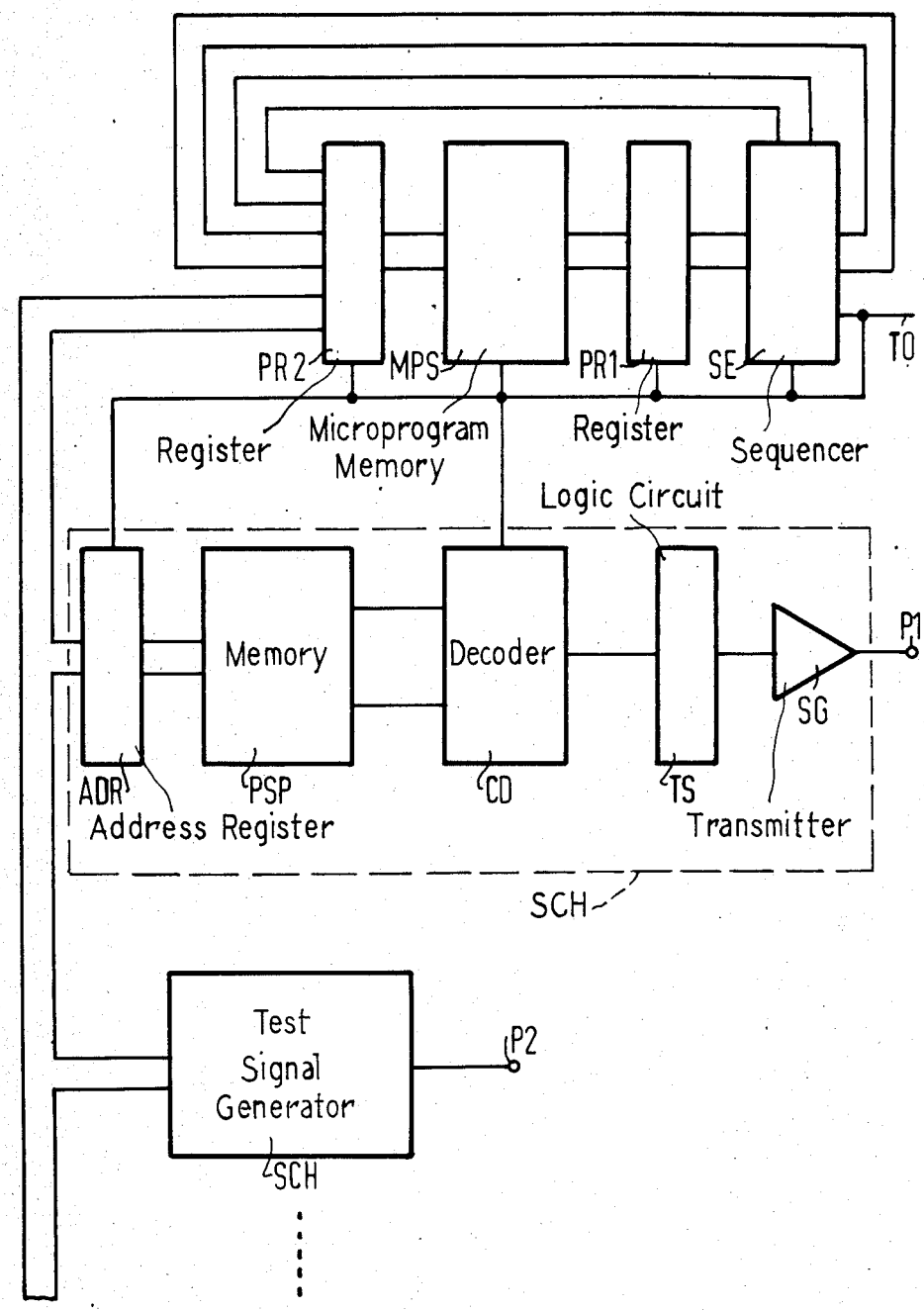
FIG. 1 is a block diagram of apparatus constructed in accordance with the invention.

Referring to FIG. 1, a test signal generator CH respectively comprises a memory PSP and a decoder CD. Respectively, one test signal generator is provided for one connector element P. The memory PSP contains the test signals assigned to the connector element P1 encoded or uncoded form. The test signals emitted by the memory PSP are decoded with the assistance of the decoder CD and supplied, for example, to a logic circuit TS. The output of the logic circuit TS can be fed to a transmitter SG which forwards the test signals to the connector element P1 or, respectively, can be connected to a receiver which receives the output signals from the unit under test over the connector element and analyzes the same by way of comparison. In the exemplary embodiment of FIG. 1, only the transmitter SG is illustrated and not the receiver. Only this case shall therefore be explained below.

An address control is provided in order to be able to emit the coded test signals contained in the memory PSP to the assigned connector element in a proper sequence. In the exemplary embodiment of FIG. 1, a single, central address control is provided for all test signal generators SCH. The central address control comprises a sequencer SE and a changeable or alterable microprogram memory MPS. The addresses for the memories PSP of the test signal generators are stored in the microprogram memory MPS. The microprogram memory MPS is, in turn, addressed by the sequencer SE.

In order to accelerate the generation of the addresses, an intermediate register PR1 can be located between the sequencer SE and the microprogram memory MPS and a second intermediate register PR2 can be disposed at the output of the microprogram memory MPS. By so doing, the sequencer SE already generate the address of the next microprogram word in the microprogram memory MPS while the preceding microprogram word is just being read from the microprogram memory SPS or, respectively, the preceding microprogram word can still be stored in the second intermediate register PR2 while the next microprogram word is being read from the microprogram memory MPS. The construction of the address control with the assistance of a sequencer SE, a microprogram memory MPS and two intermediate registers PR1 and PR2 is known per se. The sequencer can, for example, be a AM2910 manufactured by Advanced Micro Devices.

An address register ADR is connected between the second intermediate register PR2 and the memory PSP of the test signal generator in order to compensate the transit times occurring in the overall circuit. The address register ADR, however, is not absolutely necessary; its function can also be assumed by the second intermediate register PR2. Both the address control and the test signal generator are controlled with the assistance of a clock TO.

In order to emit desired test signals over the connector elements P1 and P2, the sequencer SE addresses the microprogram memory MPS. The microprogram memory MPS emits the addresses for the memory PSP in which the test signals are stored in coded form. The decoder CD converts the coded test signals into uncoded test signals which are supplied to the transmitter SG over the logic circuit TS. The transmitter SG then emits the test signals to the connector element P1 in a form which is suitable for the unit under test. The sequence in which the test signals are emitted is determined with the assistance of the sequencer SE and the microprogram memory MPS.

FIG. 5 illustrates an example of the coding of the test signals and of the required storage of the test signals in the memory MPS. It will be assumed that the test signals indicated in the first column of FIG. 5 are to be transmitted over three conductor elements P1, P2 and P3 (P3 not illustrated). The sequence of the logic levels of the test signals is constructed as a dual code. The test signals are now coded in the memory PSP with the assistance of two bits. The first bit declares whether the logic level of the test signal changes relative to the logic level of the preceding test signal; this is specified by way of the bit I. The other bit declares whether the decoder CD is to execute this change of the logic level; this bit is referenced W in FIG. 5. The coded test signals for the connector elements P1, P2, P3 derive from FIG. 5 and are referenced W1I1, W2I2 and W3I3. The initial state is illustrated in the first line. The logic level is thereby "0". Since, in the following, the decoder CD should always execute a change of the logic level when such was present, the other bit W1, W2, W3 is respectively set, therefore, to the logic level "1". The logic level changes for the connector element P3 in every line. The bit I3 is always a logic level "1" for this reason. The logic level of the test signal changes after every second test signal for the connector element P2. Correspondingly, the bit I2 likewise changes at every second test signal. Finally, the logic level for the connector element P1 changes only once, after the fourth test signal. Accordingly, only one change, namely, in the fifth line, is illustrated for the bit I1.

When the codings for the bits WNI are checked for equality, one then discovers that the codings in lines 2, 4, 6, 8 of the table are identical. A single address AD1 can therefore be assigned to these codes. The coding is correspondingly identical in line 3 and line 7. Here, also, a shared address AD2 can be assigned to the two codes.

The further codes differ; the addresses AD0 and AD3 are assigned thereto. When, therefore, the test signals specified in column 1 of FIG. 5 are to be generated at the connector elements P and the code specified in FIG. 5 is employed for coding the test signals, then only four code words need to be stored in the memory PSP in the exemplary embodiment of FIG. 5, namely, those to which the addresses AD0, AD1, AD2 and AD3 are assigned. The correct sequence of the test signals according to FIG. 5 at the connector elements P is achieved in that the addresses AD0–AD3 having the sequence specified in column 2 of FIG. 5 are generated by the address control and applied to the memory PSP.

Since a central address control is employed, respectively four coded check characters must be stored in the memory PSP in the exemplary embodiment of FIG. 5. If a decentralized address control is employed, only two coded check characters would, for example, have to be stored for the connector element P1.

The test signals stored in the memories PSP which are coded by two bits W and I must be decoded before they are supplied to the connector elements P. This occurs with the assitance of the decoder CD. It converts the logic levels of the coded test signals back into the logic levels of the test signal.

A first signal arrangement for the decoder CD is illustrated in FIG. 2. This circuit arrangement comprises a D flip-flop DK, a first multiplexer MU1 and a second multiplexer MU2. The bit W is supplied to the control input of the second multiplexer MU2 and the bit I is supplied to the control input of the first multiplexer MU1. The bit I continues to be applied to the first input of the multiplexer MU2. The second input of the multiplexer MU2 is connected to the output of the multiplexer MU1. The output of the multiplexer MU2 is connected to the D input of the flip-flop DK. The output Q of the flip-flop DK which forms the output for the test signal is connected to the first input of the multiplexer MU1; the inverting output of the flip-flop DK is connected to the second input of the multiplexer MU1. The clock TO is supplied to the clock input of the flip-flop DK.

Which output signal occurs at the output of the decoder when the corresponding bits W and I are applied at the input may be derived from the truth table of FIG. 4. The value of the output signal is illustrated in column 3. When the bit W is a logic "0", then the decoder of FIG. 2 does not change the value of the bit I. When, in contrast thereto, the logic value of the bit W is."1", then the value of the preceding test signal which is still stored in the flip-flop DK appears at the output of the decoder when the bit I is a logic "0" but, in contrast thereto, the inverted value of the preceding signal appears when the bit I has the logic value "1".

Given the circuit arrangement according to FIG. 2, it is therefore possible to through-connect the bit I to the output unaltered; however, it is also possible to again decode the bit I which contains the change information. This occurs in dependency on the bit W. The output A of the coder according to FIG. 2 is connected to a gate or logic circuit TS to which further signals S1, S2, S3 and S4 can be supplied. The signals S are through-connected to the transmitter SG when corresponding enable signals EN1–EN4 exist. When, in contrast thereto, the signal appears at the output A, then the same is through-connected to the transmitter SG since a logic "1" is at the other input of the corresponding AND circuit. Finally, a reset signal RT is supplied to the reset input R of the flip-flop DK at the beginning in order to place the flip-flop DK in a defined initial condition.

Another possible embodiment of the decoder CD is illustrated in FIG. 3. A JK flip-flop is illustrated here as the decoder. It function likewise derives from the truth table of FIG. 4, namely from column 4. The JK flip-flop emits the logical values indicated in column 4 at its output B when the values in columns 1 and 2 are present for the bits W and I.

Although we have described our invention by reference to particular illustrative embodiments thereof, many changes and modifications of the invention will become apparent to those skilled in the art without departing from the spirit and scope of the invention. We therefore intend to include within the patent warranted hereon all such changes and modifications as may reasonably and properly be included within the scope of our contribution to the art.

We claim:

1. An arrangement for generating and applying patterns of test pulses to a plurality of terminal elements of a unit under test, comprising:
   a plurality of test signal generators each storing respective test signals in coded form, and each connected to a respective terminal element, and each comprising storage means storing the test signals in coded form and generating means responsive to the coded test signals to generate the patterns of test signals; and
   an address control connected to said plurality of test signal generators and operable to sequentially address the storage means thereof to cause the respective generating meeans to generate test signals at said terminal elements in a predetermined sequence.

2. The arrangement of claim 1, wherein:
   said address control comprises a first memory;
   each test signal generator comprises a second memory and a decoder connected to said second memory for converting coded test signals into uncoded test signals; and
   said test signals comprise a two-bit code including a first bit stored in said second memory of the respective test code generator for indicating whether the logic level of the respective test code changes with respect to the preceding test code, and a second bit stored in said first memory and for indicating whether the respective decoder is to execute such change at its output.

3. The arrangement of claim 2, wherein:
   each of said decoders comprises means responsive to said two-bit code to decode a coded test signal or output the same unaltered.

4. The arrangement of claim 1, wherein said address controller comprises:
   a microprogram memory storing addresses of test signal codes; and
   a sequencer connected to and operable to sequentially access said microprogram memory.

5. The arrangement of claim 1, wherein said test signal generator comprises:
   a decoder connected to said storage means and operable to decode the coded test signals.

6. The arrangement of claim 5, and further comprising:
   an address register in said test signal generator connecting said address control to said memory.

7. The arrangement of claim 5, wherein:
   said test signal generator storage means comprises two memory locations storing a test signal code of first and second bits, the first bit indicating whether the logic level of the test signal changes with respect to the preceding test signal and the second bit indicating whether said decoder is to execute such a change at its output.

8. The arrangement of claim 7, wherein said decoder comprises:
   first and second multiplexers each comprising a first input, a second input, a control input and an output,
   said output of said first multiplexer connected to said first input of said second multiplexer,
   said control input of said first multiplexer and said second input of said second multiplexer commonly connected to receive the first bit, and
   said control input of said second multiplexer connected to receive the second bit; and
   a D flip-flop comprising a clock input for receiving a clock pulse, a D input connected to said output of said second multiplexer, a Q output serving as the output of said decoder and connected to said second input of said first multiplexer, a $\bar{Q}$ output connected to said first input of said first multiplexer, and a reset input for receiving a reset pulse.

9. The arrangment of claim 4, wherein said decoder comprises:
   a JK flip-flop including a J input for receiving the first bit, a K input for receiving the second bit, a clock input for receiving a clock pulse, and an output serving as the output of said decoder.

* * * * *